(12) United States Patent
Wu et al.

(10) Patent No.: US 6,184,061 B1
(45) Date of Patent: Feb. 6, 2001

(54) ELECTRODE OF SEMICONDUCTOR DEVICE, METHOD OF MANUFACTURING THEREOF, AND THE SEMICONDUTOR DEVICE

(75) Inventors: Qiang Wu; Yoshihiro Tomita, both of Tokyo (JP)

(73) Assignee: Mitsubishi Denki Kabushiki Kaisha, Tokyo (JP)

( * ) Notice: Under 35 U.S.C. 154(b), the term of this patent shall be extended for 0 days.

(21) Appl. No.: 09/166,908

(22) Filed: Oct. 6, 1998

(30) Foreign Application Priority Data

Apr. 24, 1998 (JP) .................................................. 10-115367

(51) Int. Cl.$^7$ .................................................. H01L 21/28
(52) U.S. Cl. .................. 438/106; 438/614; 438/107; 438/108; 438/613; 438/653; 438/678
(58) Field of Search ...................................... 257/738, 786, 257/731, 737, 780, 772, 784, 779, 781, 782; 438/106–108, 613–614, 653, 678

(56) References Cited

U.S. PATENT DOCUMENTS 5,118,029 * 6/1992 Fuse et al. ............................ 228/198
5,534,127 * 7/1996 Sakai ..................................... 205/125
5,583,073 * 12/1996 Lin et al. .............................. 438/614
5,648,686 * 7/1997 Hirano et al. ........................ 257/778
5,736,790 * 4/1998 Iyogi et al. ........................... 257/780

FOREIGN PATENT DOCUMENTS 1-185920  7/1989  (JP) .
8-306816  11/1996 (JP) .

* cited by examiner

*Primary Examiner*—Matthew Smith
*Assistant Examiner*—Igwe U. Anya
(74) *Attorney, Agent, or Firm*—McDermott, Will & Emery

(57) ABSTRACT

An electrode of a semiconductor device comprising: a pad; an electroless diffusion prevention film formed on a surface of the pad for preventing material of the pad from diffusing; a solder precoat film formed on a surface of the electroless diffusion prevention film, and having a thickness not larger than a predetermined value, for preventing a solder bump on the solder precoat film from defective breaking; and a predetermined intermetallic compound layer formed in the solder precoat film in the vicinity of a boundary surface between the solder precoat film and the electroless diffusion prevention film, the intermetallic compound layer having a bonded surface bonded substantially to the whole of the surface of the electroless diffusion prevention film.

15 Claims, 8 Drawing Sheets

ELECTRODE OF SEMICONDUCTOR DEVICE, METHOD OF MANUFACTURING THEREOF, AND THE SEMICONDUTOR DEVICE

BACKGROUND OF THE INVENTION

1. Field of the Invention

The present invention relates to a semiconductor device such as a flip chip, a BGA (Ball Glid Array), an CSP (Chip Scale Package), or the like, an electrode of the semiconductor device, and a method of manufacturing the electrode.

2. Description of the Related Art

A flip chip, a BGA, an CSP and so on are conventionally known as semiconductor devices which can satisfy a demand to increase the number of pins of the device. Such a semiconductor device has, for example, an electrode structure called a "solder bump structure" manufactured by electroless plating (for example, see JP-A-8-306816, and JP-A-1-185920).

FIG. 8 is a sectional view illustrating an electrode structure of a flip chip which is an example of a conventional electrode structure. This electrode has a pad 50 formed of metal such as aluminum (Al) or the like. The pad 50 is formed on a chip substrate 51, and on the surface thereof, with an electroless barrier metal film 52 for protecting the pad 50.

The electroless barrier metal film 52 has a double-layer structure constituted by an electroless diffusion prevention film 52a for preventing Al which is a material of the pad 50 from diffusing, and an electroless oxidation prevention film 52b for preventing the surface of the pad 50 and the electroless diffusion prevention film 52a from being oxidized. For example, an Ni—P film is used for the electroless diffusion prevention film 52a. On the other hand, for example, an electroless Au film is used as the electroless oxidation prevention film 52b.

The flip chip is mounted onto a circuit board in such a manner that a solder bump 53 is attached to the surface of the electroless barrier metal film 52, and then the solder bump 53 is melted on the wiring pattern. The reference numeral 54 represents a passivation film for preventing the pad 50 from being oxidized.

However, in the electrode with the above-mentioned solder bump 53 attached thereto, a columnar intermetallic compound layer 60 was formed in the solder bump 53 so as to erect on the surface of the electroless barrier metal film 52 as shown in FIG. 9A. Therefore, there was a problem that the solder bump 53 was apt to defectively break when force F was applied to the solder bump 53 from the outside, as shown in FIG. 9B.

More specifically, the electroless Au film 52b melts into the solder bump 53 when the solder bump 53 is attached to the electroless barrier metal film 52. As a result, the solder bump 53 comes into contact with the surface of the electroless Ni—P film 52a. On the other hand, generally, the electroless Ni—P film 52a is microcrystalline or amorphous because of eutectoid of reducer elements P in a reducer used for electroless plating. As a result, Ni in the surface of the electroless Ni—P film 52a enters the solder bump 53. Ni entering the solder bump 53 performs a chemical reaction with Sn in the solder bump 53. Consequently, an intermetallic compound layer 60 of $Ni_3Sn_4$ is produced in the solder bump 53.

On the other hand, when Ni is released from the electroless Ni—P film 52a, the content of the reducer elements P in the electroless Ni—P film 52a increases in the vicinity of the surface thereof (for example, increases from 9.5 wt % to 17 wt %). As a result, an amorphous layer containing the reducer elements P at high concentration (P-rich amorphous layer) is formed in the electroless Ni—P film 52a in the vicinity of the surface thereof. Because of existence of this P-rich amorphous layer, the growth of the above-mentioned intermetallic compound layer 60 is blocked in a direction h along the surface of the electroless Ni—P film 52a. Consequently, the produced intermetallic compound layer 60 grows in its height-wise direction v.

In such a manner, the intermetallic compound layer 60 grows in its height-wise direction v. Therefore, for example as shown in FIG. 9A, the intermetallic compound layer 60 is formed in the form of a column in the solder bump 53. In this case, the bonding area between the intermetallic compound layer 60 and the electroless Ni—P film 52a is very small, and the height of the intermetallic compound layer 60 is comparatively high, for example, 1 ($\mu$m) or more. Further, an P-rich amorphous layer is formed in the electroless Ni—P film 52a in the vicinity of the surface thereof.

Therefore, a bonding force between the solder bump 53 and the electroless Ni—P film 52a is very small. Accordingly, when a force F is applied to the solder bump 53 from the outside during the work of soldering by melting the solder bump 53, the intermetallic compound layer 60 itself is broken, or defective breaking is produced between the intermetallic compound layer 60 and the P-rich amorphous layer as shown in FIG. 9B. Therefore, an electrode cannot be attached to the wiring pattern. After all, the device often becomes a rejected product.

SUMMARY OF THE INVENTION

It is therefore an object of the present invention to provide an electrode of a semiconductor device and a method of manufacturing the electrode, in which defective breaking of a solder bump (solder ball) can be prevented when a semiconductor device is manufactured by an electroless film formation process such as electroless plating.

It is another object of the present invention to provide a semiconductor device having the above-mentioned electrode so that the reliability thereof is improved.

In order to achieve the above problem, according to an aspect of the present invention, provided is an electrode of a semiconductor device comprising: a pad; an electroless diffusion prevention film formed on a surface of the pad for preventing material of the pad from diffusing; a solder precoat film formed on a surface of the electroless diffusion prevention film, and having a thickness not larger than a predetermined value, for preventing a solder bump or a solder ball from defective breaking; and a predetermined intermetallic compound layer formed in the solder precoat film in the vicinity of a boundary surface between the solder precoat film and the electroless diffusion prevention film, the intermetallic compound layer having a bonded surface bonded substantially to the whole of the surface of the electroless diffusion prevention film. The solder precoat film is necessary to have a thickness so that an intermetallic compound layer having a bonded surface bonded substantially to the whole of the surface of said electroless diffusion prevention film, is formed in said solder precoat film in the vicinity of a boundary surface between said solder precoat film and said electroless diffusion prevention film.

According to another aspect of the present invention, provided is an electrode of a semiconductor device comprising: a pad; an electroless diffusion prevention film formed on a surface of the pad for preventing material of the pad from diffusing; a solder bump of a solder ball formed on a surface of the electroless diffusion prevention film; and a predetermined intermetallic compound layer formed in the solder bump of the solder ball in the vicinity of a boundary surface between the solder bump or the solder ball and the electroless diffusion prevention film, the intermetallic compound layer having a bonded surface bonded substantially to the whole of the surface of the electroless diffusion prevention film.

According to a further aspect of the present invention, provided is a semiconductor device comprising a wiring pattern electrically connected to electronic parts; and electrodes defined above and electrically connected to the electronic parts through the wiring pattern.

According to a further aspect of the present invention, provided is a method of manufacturing an electrode of a semiconductor device comprising the steps of: forming an electroless barrier metal film, as a pad protection film, on a surface of a pad; and forming a solder precoat layer on a surface of the electroless barrier metal film so as to have a thickness not larger than a predetermined value for preventing a solder bump of a solder ball from defective breaking.

According to a further aspect of the present invention, provided is a method of manufacturing an electrode of a semiconductor device comprising the steps of: forming an electroless diffusion prevention film, as a pad material diffusion prevention film, on a surface of a pad; and forming a solder precoat layer on a surface of the electroless diffusion prevention film so as to have a thickness not larger than a predetermined value for preventing a solder bump of a solder ball from defective breaking.

DESCRIPTION OF THE PREFERRED EMBODIMENTS

Embodiments of the present invention will be described below in detail with reference to the accompanying drawings.

First Embodiment

Figure 1:
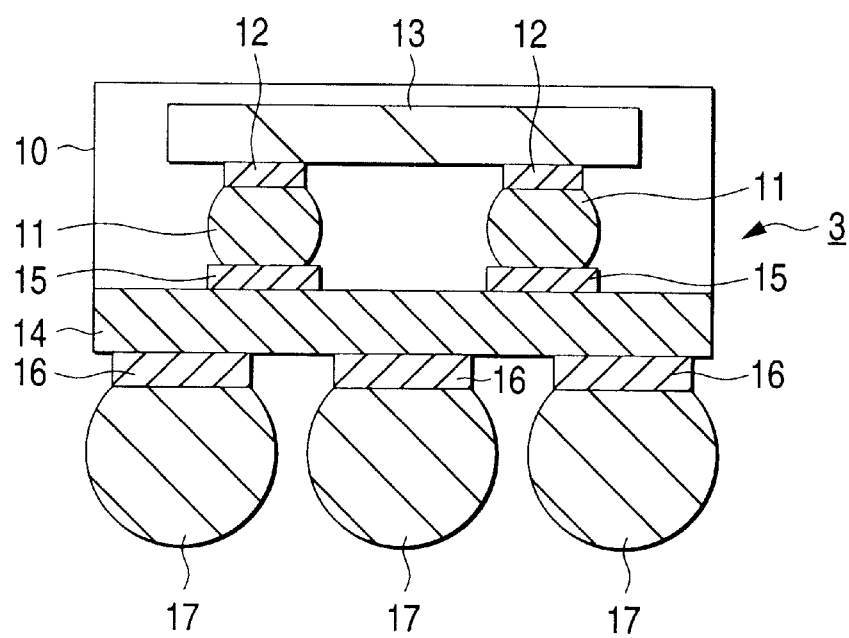
FIG. 1 is a sectional view illustrating a configuration of an electrode of a semiconductor device according to a first embodiment of the present invention.
Figure 1:
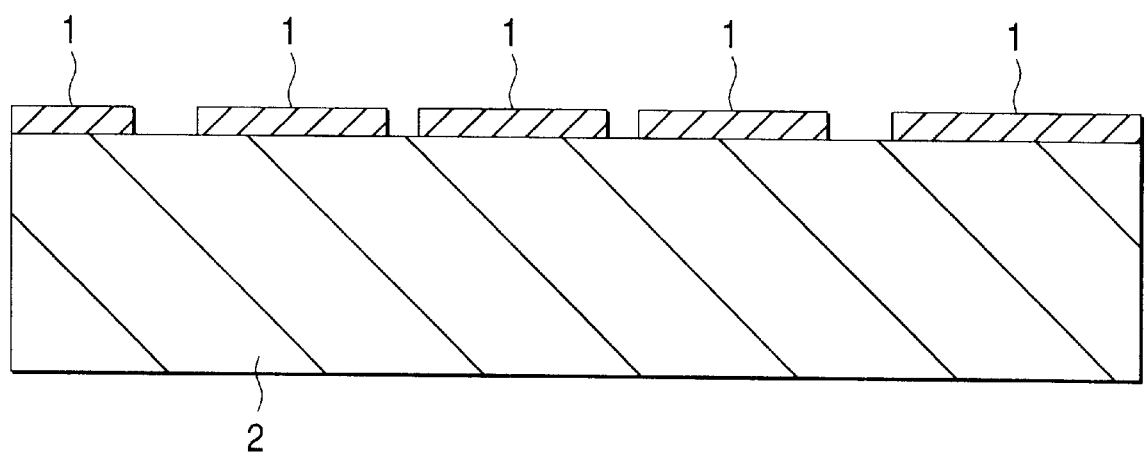

FIG. 1 is a sectional view illustrating a configuration of a semiconductor device according to a first embodiment of the present invention. This semiconductor device is a so-called BGA-type semiconductor device, and constituted by a semiconductor package 3 mounted on a printed-circuit board 2 having a plurality of board electrodes 1 arranged in the form of a lattice.

Various electronic parts (not-shown) such as semiconductor packages other than the semiconductor package 3, resistors, capacitors, etc., are mounted on the circuit board 2. The board electrodes 1 are connected to wiring patterns (not-shown) for electrically connecting these electronic parts to the semiconductor package 3.

The semiconductor package 3 has a package portion 10 forming its external appearance. A semiconductor chip 13 having a plurality of chip electrodes 12 to which solder bumps (solder balls) 11 are attached are provided in the inside of the package portion 10. A plurality of electronic parts such as transistors are provided in the semiconductor chip 13. The above-mentioned chip electrodes 12 are electrically connected to these electronic parts through wiring patterns.

The semiconductor chip 13 is attached to a package board 14 of copper (Cu) or the like. More specifically, a plurality of inner electrodes 15 are provided on the inner surface of the package board 14, and the chip electrodes 12 of the semiconductor chip 13 are bonded to these inner electrodes 15 through the solder bumps 11 respectively. In such a manner, the semiconductor chip 13 is attached to the package board 14.

A plurality of outer electrodes 16 to be bonded to the board electrodes 1 of the circuit board 2 are provided on the outer surface of the package board 14. Solder bumps 17 are attached to the outer electrodes 16 respectively. To mount this semiconductor package 3 on the circuit board 2, the solder bumps 17 attached to the outer electrodes 16 are melted so as to be bonded to the board electrodes 1.

The above-mentioned inner and outer electrodes 15 and 16 are connected to wiring patterns disposed in the package board 14 so that the semiconductor chip 13 in the semiconductor package 3 is electrically connected to various electronic parts mounted on the circuit board 2.

FIG. 2A shows the structure of the chip electrode 12 to which the solder bump 11 is not attached yet, while FIG. 2B shows the structure of the chip electrode 12 to which the solder bump 11 has been attached.

The board electrode 1 in FIG. 1 has the same structure as that shown in FIG. 2A. In addition, the chip electrode 12, the inner electrodes 15 and the outer electrodes 16 in FIG. 1 have the same structure as that shown in FIG. 2B. Further, although in the structure shown in FIG. 1, the solder bumps 11 and 17 are already attached to the chip electrodes 12, the inner electrodes 15 and the outer electrodes 16, the structure is the same as that shown in FIG. 2A before the solder bumps 11 and 17 are attached thereto. Therefore, description will be made below about the states before the solder bump 11 is not attached yet and after the solder bump 11 is already attached.

The chip electrode 12 to which the solder bump 11 is not attached yet has a pad 20 of metal such as copper (Cu) or the like. The pad 20 is provided on a chip board 21. On the surface of the pad 20, an electroless Ni—P film 22$a$ which is a part of an electroless barrier metal film 22 is formed for protecting the pad 20. The electroless Ni—P film 22$a$ is a diffusion prevention film for preventing Cu, which is a material of the pad 20, from diffusing.

A solder precoat film 23 is formed on the surface of the electroless Ni—P film 22a. The solder precoat film 23 is an eutectic of Sn/Pb (for example, 63 wt % Sn-37 wt % Pb) so as to increase bonding force between the chip electrode 12 and the solder bump 11. Film thickness d1 of the solder precoat film 23 is set to be not more than 15 ($\mu$m) (for example, 3 ($\mu$m)), much smaller than the height of the solder bump 11.

An intermetallic compound layer 24 of $Ni_3Sn_4$ is formed in the solder precoat film 23 in the vicinity of the boundary surface between the solder precoat film 23 and the electroless Ni—P film 22a. The intermetallic compound layer 24 has a bonded surface 24a bonded to the whole of the surface of the electroless Ni—P film 22a. That is, the bonding area between the intermetallic compound layer 24 and the electroless Ni—P film 22a is substantially equal to the surface area of the solder precoat film 23. Thickness d2 of the intermetallic compound layer 24 is, for example, 0.5 ($\mu$m).

The reference numeral 25 represents a passivation film for preventing the chip electrode 12 from being oxidized.

The chip electrode 12 to which the solder bump 11 has been attached is manufactured by bonding the solder bump 11 to the surface of the chip electrode 12 shown in FIG. 2A. In this case, the solder precoat film 23 is fused into the solder bump 11. Consequently, the chip electrode 12 has such a structure that the solder bump 11 is formed on the surface of the electroless Ni—P film 22a as shown in FIG. 2B. In this case, the above-mentioned intermetallic compound layer 24 is formed in the solder bump 11 in the vicinity of the boundary surface between the solder bump 11 and the electroless Ni—P film 22a.

As described above, in the chip electrode 12 to which the solder bump 11 has been attached, the intermetallic compound layer 24 which is thin and has a bonded surface 24a bonded to the whole of the surface of the electroless Ni—P film 22a is formed in the solder bump 11 in the vicinity of a boundary surface between the solder bump 11 and the electroless Ni—P film 22a. The intermetallic compound layer 24 thus formed has a larger bonding force than that in a columnar intermetallic compound layer.

Figure 3:
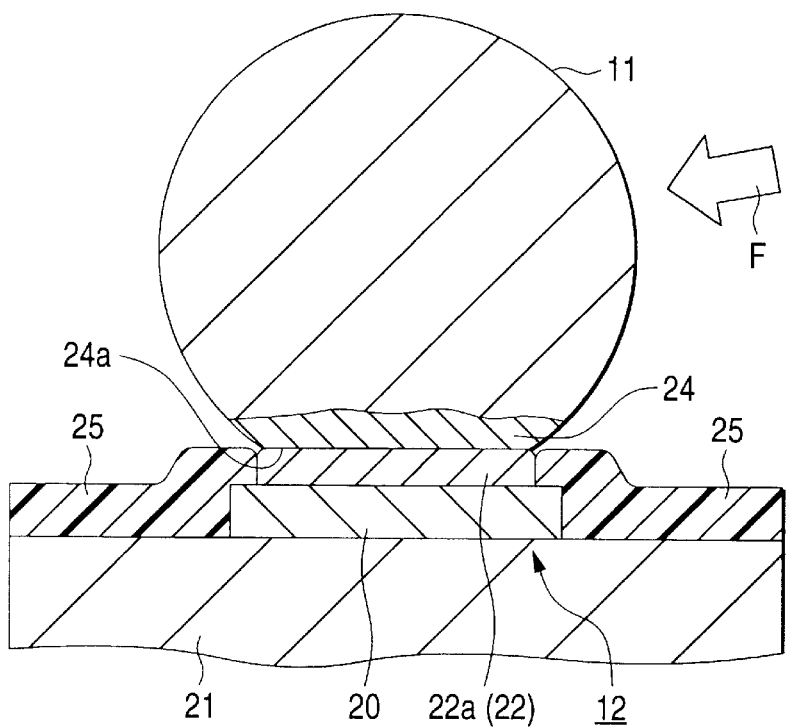
FIG. 3($a$) and 3($b$) illustrate a view for explaining breaking of the chip electrode.
Figure 3:
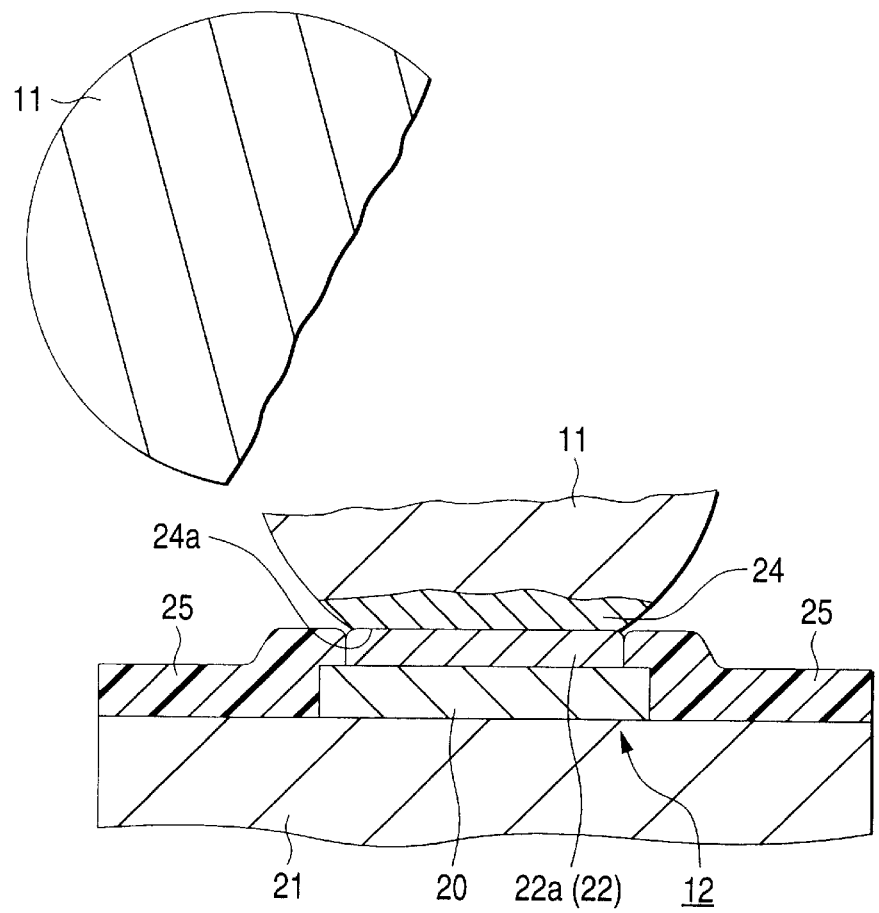

Therefore, for example, even if a force F is applied to the solder bump 11 from the outside as shown in FIG. 3A, only a part of the solder bump 11 breaks as shown in FIG. 3B, because of the existence of the intermetallic compound layer 24 having a large bonding force. That is, the solder bump 11 is subjected to normal breaking. With such normal breaking, the reliability of the bonded portion can be regarded as high. It is therefore possible to provide an electrode improved in reliability, so that it is possible to provide a semiconductor device high in reliability.

Figure 4:
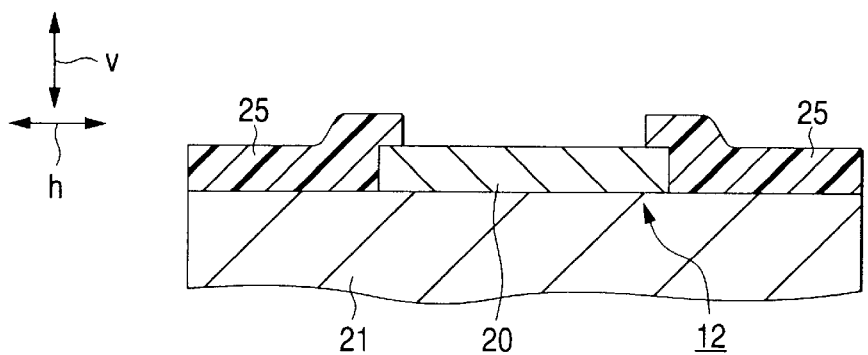
FIGS. 4($a$)–4($e$) illustrate a process of manufacturing a chip electrode.
Figure 4:
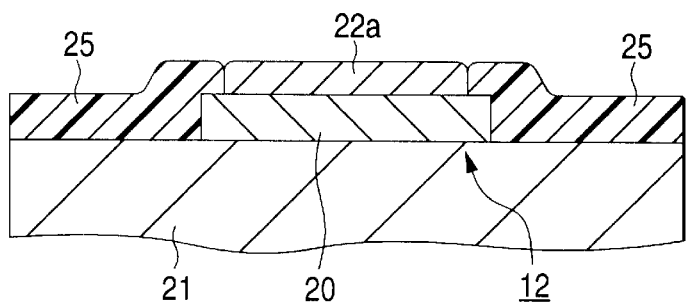
Figure 4:
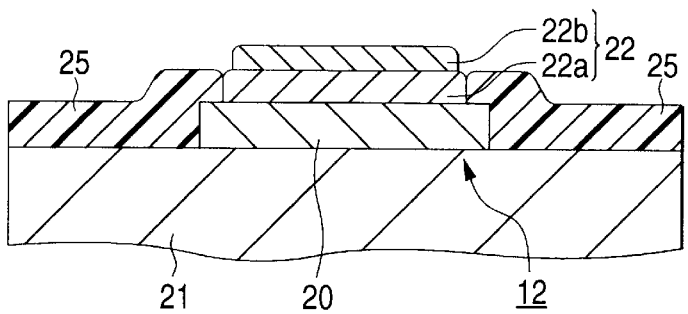
Figure 4:
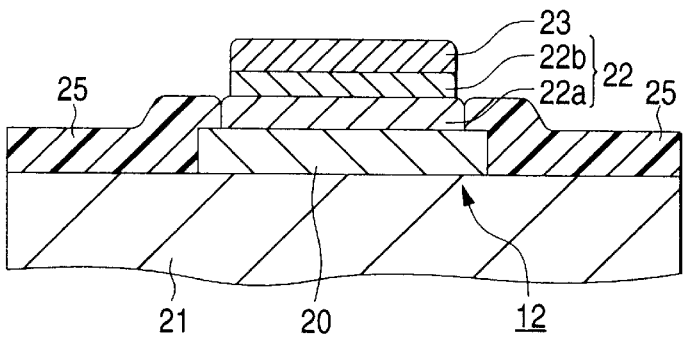
Figure 4:
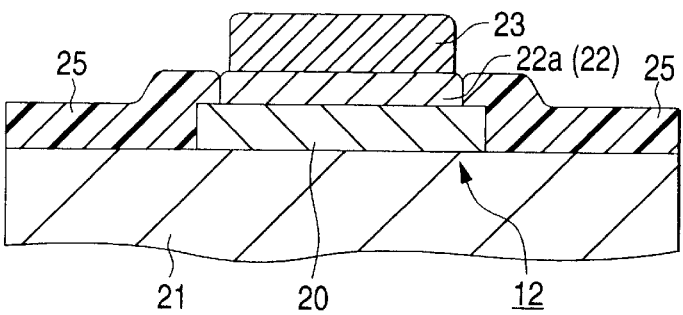
Figure 5:
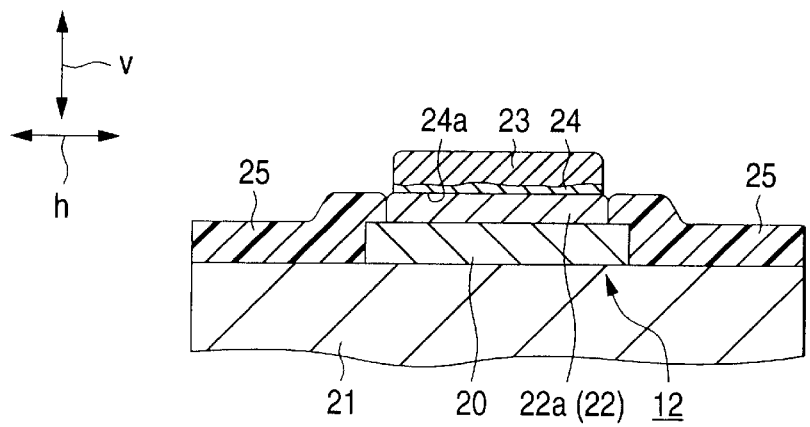
FIGS. 5($a$)–(5$c$) illustrate process of manufacturing a chip electrode.
Figure 5:
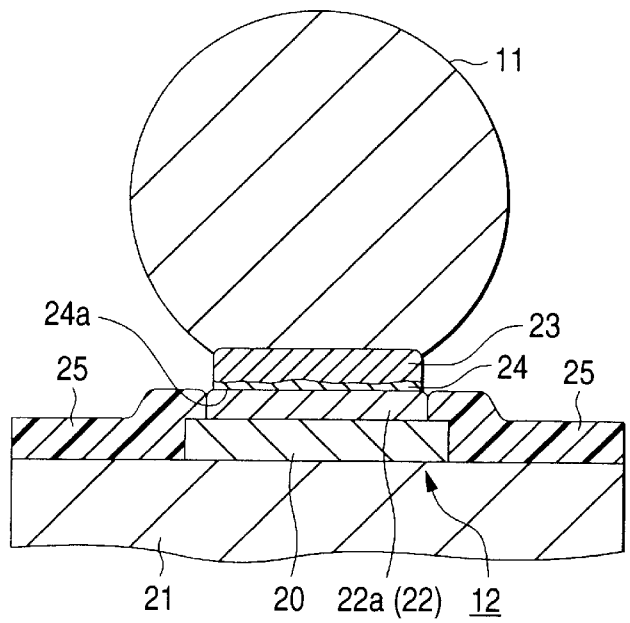
Figure 5:
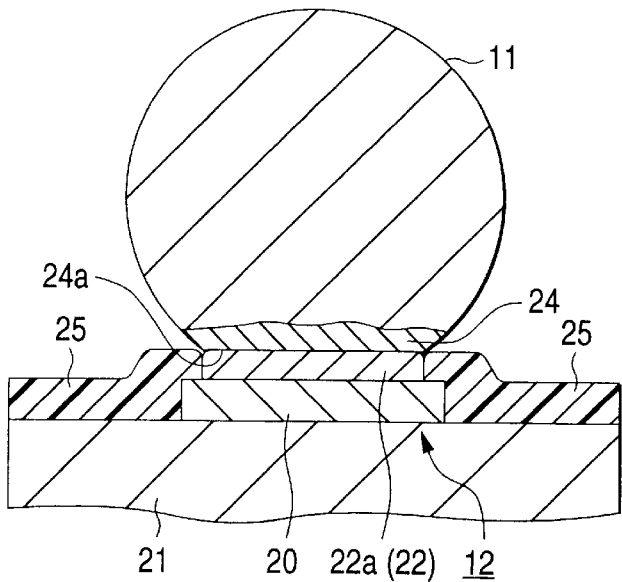

FIGS. 4 and 5 are views for explaining a process to manufacture the above-mentioned chip electrode 12. As shown in FIG. 4A, the passivation film 25 is deposited by evaporation on the surface of the chip substrate 21 near the pad 20 and on the surface of the pad 20 except the part of the pad 20 to which the solder bump 11 is to be attached. Then, the electroless Ni—P film 22a is formed on the part of the surface of the pad 20, to which the solder bump 11 is to be attached, for example, by electroless plating, as shown in FIG. 4B.

That is, the chip electrode 12 with the passivation film 25 already formed is immersed in an electroless plating solution using, for example, a hypophosphorous acid as a reducer so as to precipitate Ni ions on the surface of the pad 20. In this case, phosphorus (P) as reducer elements contained in the reducer precipitates on the surface of the pad 20 at the same time. Consequently, an Ni film containing P is produced. Thus, electroless Ni—P film 22a is formed.

Then, as shown in FIG. 4C, the electroless Au film 22b which is an oxidation prevention film for preventing the pad 20 from surface oxidation is formed on the surface of the electroless Ni—P film 22a by electroless plating in the same manner as above-mentioned. Thus, the electroless barrier metal film 22 constituted by a double-layer structure of the electroless Ni—P film 22a and the electroless Au film 22b is formed.

Next, as shown in FIG. 4D, the surface of the electroless Au film 22b, that is, the surface of the electroless barrier metal film 22 is coated with a Sn/Pb eutectic paste to an extent corresponding to a film thickness of 3 ($\mu$m) by screen printing. Then, the surface is heated to melt at predetermined temperature (for example, 225° C.). Thus, the solder precoat film 23 is formed.

When the solder precoat film 23 is formed on the surface of the electroless Au film 22b, the electroless Au film 22b is fused into the solder precoat film 23, so that the solder precoat film 23 comes into contact with the surface of the electroless Ni—P film 22a, as shown in FIG. 4E. When the solder precoat film 23 is contact with the electroless Ni—P film 22a, Ni existing in the electroless Ni—P film 22a near its surface enters the solder precoat film 23. Consequently, Ni makes a chemical reaction on Sn in the solder precoat film 23, so that an intermetallic compound layer 24 of $Ni_3Sn_4$ is produced.

On the other hand, the solder precoat film 23 is so thin that this produced intermetallic compound layer 24 is blocked in its growth in the height-wise direction v, while the growth in the direction h along the surface of the electroless Ni—P film 22a is accelerated. Therefore, an intermetallic compound layer 24 which is thin and has a bonded surface 24a bonded to the whole of the surface of the electroless Ni—P film 22a is formed in the solder precoat film 23 in the vicinity of the boundary surface between the solder precoat film 23 and the electroless Ni—P film 22a, as shown in FIG. 5A.

Description will be made more specifically. When the electroless Au film 22b is fused into the solder precoat film 23, Sn which is a part of the solder material is combined with Au, so that an $AuSn_4$ compound is produced in the inside of the solder precoat film 23. The solder precoat layer 23 is so thin that this $AuSn_4$ compound is produced in concentration in the vicinity of the boundary surface between the solder precoat film 23 and the electroless Ni—P film 22a.

In addition, the solder precoat film 23 is so thin that the content of Pb and Sn which are materials of solder is originally small. Accordingly, because of the combination of Sn with Au, a Pb-rich layer is produced in the vicinity of the boundary surface between the solder precoat layer 23 and the electroless Ni—P film 22a.

Thus, a layer constituted by the $AuSn_4$ compound layer and the Pb-rich layer is produced in the solder precoat film 23 in the vicinity of the boundary surface between the solder precoat film 23 and the electroless Ni—P film 22a. This produced layer itself has not only a function to block the growth of the intermetallic compound layer 24 in the height-wise direction v, but also a function to accelerate the growth in the direction h along the surface of the electroless Ni—P film 22a. Further, the above-mentioned layer has another function to prevent Ni in the electroless Ni—P film 22a from entering the solder precoat layer 23. Consequently, a P-rich amorphous layer which is a factor to accelerate the growth of the intermetallic compound layer 24 in the height-wise direction v is prevented from being produced. As a result, the intermetallic compound layer 24 grows in the direction h along the surface of the electroless Ni—P film 22a.

Then, the solder bump 11 is attached to the chip electrode 12 as shown in FIG. 5B. As a result, the solder precoat film 23 is fused into the solder bump 11 as shown in FIG. 5C. In this case, the $AuSn_4$ compound and Pb formed in the solder precoat film 23 in the vicinity of the boundary surface between the solder precoat film 23 and the electroless Ni—P film 22a diffuse into the solder bump 11 in progression. On the other hand, the intermetallic compound layer 24 functions as barrier layer to thereby prevent Ni in the electroless Ni—P film 22a from entering the solder bump 11.

As a result, a P-rich amorphous layer is prevented from being produced in the electroless Ni—P film 22a in the vicinity of the surface thereof after the solder bump 11 is attached. Consequently, the growth of the intermetallic compound layer 24 in the height-wise direction v is blocked even after the solder bump 11 is attached. In such a manner, the chip electrode 12 to which the solder bump 11 has been attached is manufactured.

According to this first embodiment, as described above, a thin solder precoat layer 23 is formed on the surface of the electroless barrier metal 22 to thereby form an intermetallic compound layer 24 which is thin and large in the bonded area with the electroless Ni—P film 22a. Such an intermetallic compound layer 24 has a larger bonding force than that in a columnar intermetallic compound layer.

It is therefore possible to increase a bonding force between the solder bump 11 and the pad 20. Accordingly, it is possible to prevent the solder bump 11 from defective breaking. It is therefore possible to provide a high-reliability electrode and a high-reliability semiconductor device.

The present inventors carried out a shear test upon the chip electrode 12 to which the solder bump 11 was attached, in order to confirm a shear force between the electroless Ni—P film 22a and the solder bump 11. Specifically, stress was applied to the solder bump 11 by a stress applying tool when the diameter of the pad 20, that is, the diameter of the electroless Ni—P film 22a was 0.6 mm.

As a result, in a chip electrode having a conventional structure, the shear strength in one solder bump was 0.9 to 1.6 (Kg/bump), and the defective-breaking rate was larger than 40%. On the other hand, in the chip electrode 12 according to this first embodiment, it was confirmed that the shear strength in one solder bump 11 was large to be 1.45 to 1.80 (Kg/bump), and the defective—breaking rate was 0%.

In addition, the solder precoat film 23 is formed of a Sn/Pb eutectic. It is therefore possible to block the growth of the intermetallic compound layer 24 in the height-wise direction v well.

Second Embodiment

Figure 2:
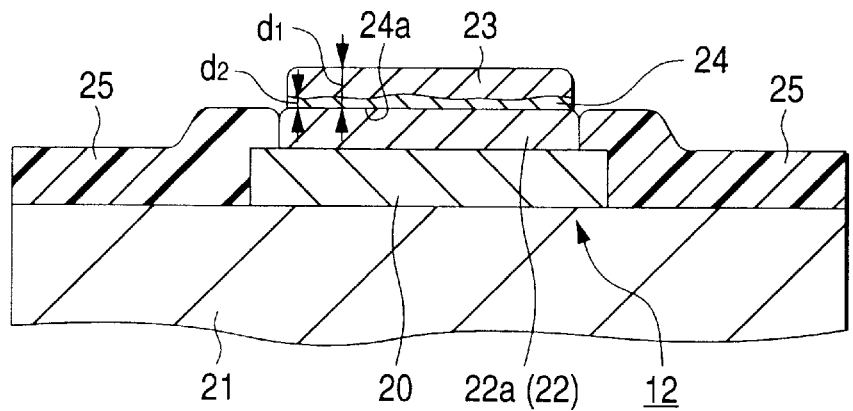
FIG. 2($a$) and 2($b$) are sectional views illustrating a configuration of a chip electrode to which a solder bump has not been attached yet, and to which a solder bump has been attached, respectively.
Figure 2:
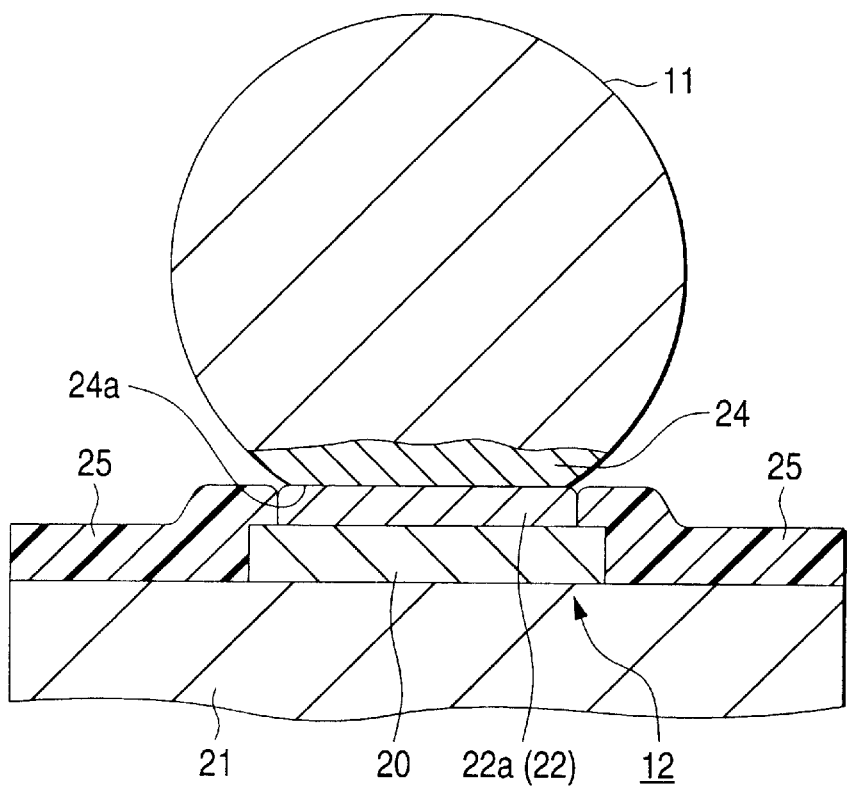
Figure 6:
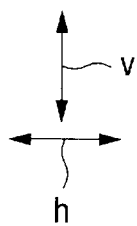
FIGS. 6($a$)–(6$c$) illustrate part of a process to manufacture an electrode of a semiconductor device according to a second embodiment of the present invention.
Figure 6:
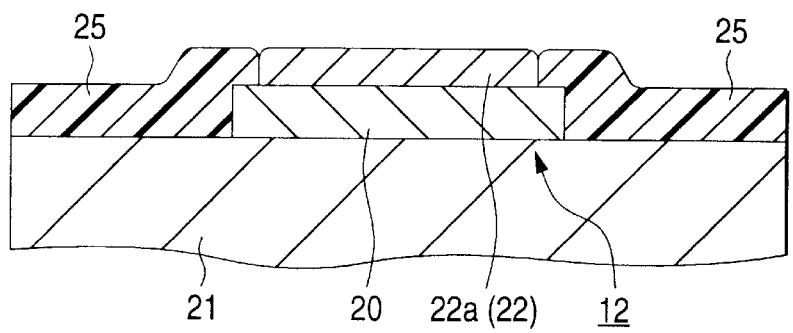
Figure 6:
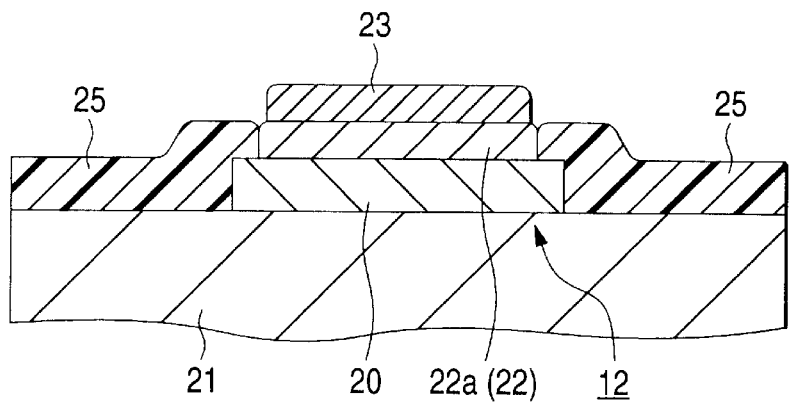
Figure 6:
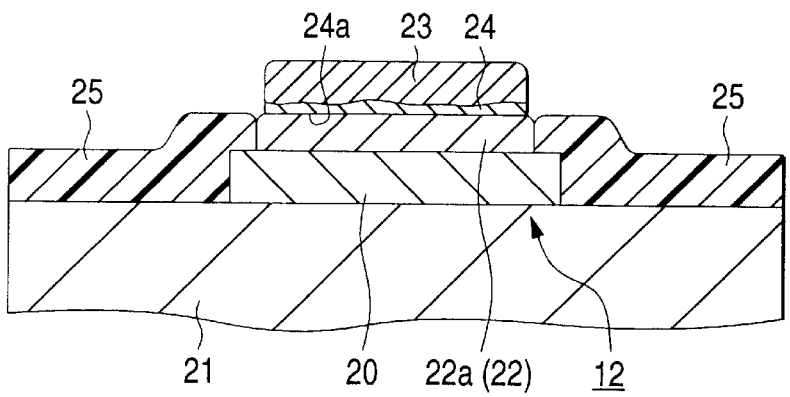

FIG. 6 is a view illustrating a part of a process to manufacture an electrode of a semiconductor device according to a second embodiment of the present invention. Specifically, FIGS. 4B to 4E and FIG. 5A should be replaced by FIGS. 6A to 6C. In FIG. 6, portions having the same functions as those in FIG. 2 are referenced correspondingly.

In the above-mentioned first embodiment, the solder precoat film 23 is formed after the electroless Au film 22b having a function as oxidation prevention film is formed on the surface of the electroless Ni—P film 22a, as a part of the electroless barrier metal film 22. On the other hand, the solder precoat film 23 has also a function as oxidation prevention film. Therefore, in this second embodiment, instead of forming an electroless Au film, a solder precoat film 23 is formed on the surface of an electroless Ni—P film 22a directly, and this solder precoat film 23 is used as a film for attaining both the functions for increasing a bonding force and for preventing oxidation.

More specifically, a chip electrode 12 (see FIG. 6A) to which the electroless Ni—P film 22a has been formed is coated with a Sn/Pb eutectic paste by screen printing. Then, the coated chip electrode 12 is heated to melt at predetermined temperature (for example, 225° C.) in a reflow furnace. As a result, the solder precoat film 23 is formed as shown in FIG. 6B.

After the solder precoat film 23 is formed, Ni enters the precoat film 23 from the electroless Ni—P film 22a, so that an intermetallic compound layer 24 is formed in the solder precoat film 23 in the vicinity of the boundary surface between the solder precoat layer 23 and the electroless Ni—P film 22a. In this case, there is no fear that the growth of the intermetallic compound layer 24 is blocked in the direction h along the surface of the electroless Ni—P film 22a, as mentioned above. Accordingly, the intermetallic compound layer 24 which is thin and large in bonding area is formed as shown in FIG. 6C.

Also according to this second embodiment, as described above, it is possible to form a laminated intermetallic compound layer 24 having a large bonding force. In the same manner as in the above first embodiment, it is therefore possible to prevent the solder bump 11 from defective breaking, and it is possible to provide a high-reliability electrode.

The present inventors carried out a shear test upon the chip electrode 12 to which the solder bump 11 was attached in the same manner as in the above first embodiment. The result was quite the same as that in the first embodiment.

Further, the present inventors carried out a pull test upon the chip electrode 12 to which the solder bump 11 had been attached, in order to confirm the anti-tensile characteristics between the electroless Ni—P film 22a and the solder bump 11. Specifically, the circuit board 2 to which the semiconductor package 3 had been attached was pressed down by a predetermined member, and the semiconductor package 3 was pulled upward.

As a result, in a chip electrode having a conventional structure, the pull strength was 30 to 70 (Kg/100-ball; on the assumption that 100 board electrodes 1 and outer electrodes 16 are provided), and the defective-breaking rate was larger than 70%. On the other hand, in the chip electrode 12 according to this second embodiment, the pull strength was large to be 75 to 83 (Kg/100-ball), and the defective-breaking rate was smaller than 15%.

In addition, it is possible to accelerate the growth of the intermetallic compound layer 24 in the direction along the surface of the intermetallic compound layer 24 more suitably than in the above first embodiment in which the electroless Au film 22b is formed. That is, when the electroless Au film 22b is formed on the surface of the electroless Ni—P film 22a, the surface of the electroless Ni—P film 22a is corroded by the displacement reaction of Au in the electroless Au film 22b. In addition, also Ni in the electroless Ni—P film 22a enters the electroless Au film 22b. As a result, a pin hole is formed in the electroless Au film 22b, and Ni is oxidized through the pin hole.

Therefore, the solder wettability of the electroless barrier metal film 22 is not sufficient. Accordingly, there is a fear that the growth of the intermetallic compound layer 24 is blocked more or less in the direction along the surface of the electroless Ni—P film 22a. On the other hand, according to this second embodiment, because the electroless Au film 22b is not formed, it is possible to accelerate the growth of the intermetallic compound layer 24 more suitably in the direction h along the surface of the electroless Ni—P film 22a.

In addition, expensive Au powder is not required. Accordingly, it is possible to reduce the cost. In addition, because a step of manufacturing an electroless Au film can be eliminated, it is possible to make the manufacturing process simple.

Third Embodiment

The solder precoat film 23 is formed by screen printing in the above first and second embodiments. However, in this third embodiment, a solder precoat film 23 is formed by electroless solder plating. The solder precoat film 23 is formed by heating and melting at predetermined temperature (for example, 225° C.) after the electroless solder plating.

According to this configuration, it is possible to mount semiconductor devices at high density, increase the number of the pins, make the pad aperture size fine, and so on, in comparison with the case where "the solder precoat film 23" is formed by printing. That is, in the case of printing, a printing mask of metal or plastic is required, and the minimum size of pads and the minimum distance between the pads depend on the size of holes of the printing mask and the distance between the holes. In view of restriction on technology and strength, there is a limit in the reduction of the hole size and hole distance of the printing mask. Therefore, there is also a limit in the reduction of the pad size and the pad distance. On the other hand, in the case of electroless solder plating, a film is formed by chemical reaction. Accordingly, there is no problem in theory even if the size of pads and the distance between the pads are made as small as possible. It is therefore possible to attain increase of the number of pins, and so on.

Other Embodiments

Three embodiments of the present invention are described above. However, not to say, this invention may be carried out by other embodiments than the above-mentioned embodiments. For example, in the above embodiments, description is made upon the case where the electroless Ni—P film 22a is used as electroless diffusion prevention film by way of example. However, not to say, for example, an electroless Ni-B film and an electroless Ni—N film may be used as the electroless diffusion prevention film. In addition, an electroless film of an Ni alloy such as Ni—Sn—P, Ni—Sn—B, Ni—W—P, Ni—W—B, Ni—Co—P, Ni—Cu—P, Ni—Cu—B, etc., may be used as the electroless diffusion prevention film.

Also in this case, a thin intermetallic compound layer 24 having a bonded surface 24a bonded substantially to the whole of the surface of the electroless Ni—P film 22a is formed, so that it is possible to prevent the solder bump 11 from defective breaking. Accordingly, it is possible to provide a semiconductor device improved in its reliability.

In addition, the Pb content of the solder precoat film 23 is set to be 37 wt % in the above embodiments. However, the higher the Pb content of the solder precoat layer 23 becomes, the more preferable it is.

Figure 7:
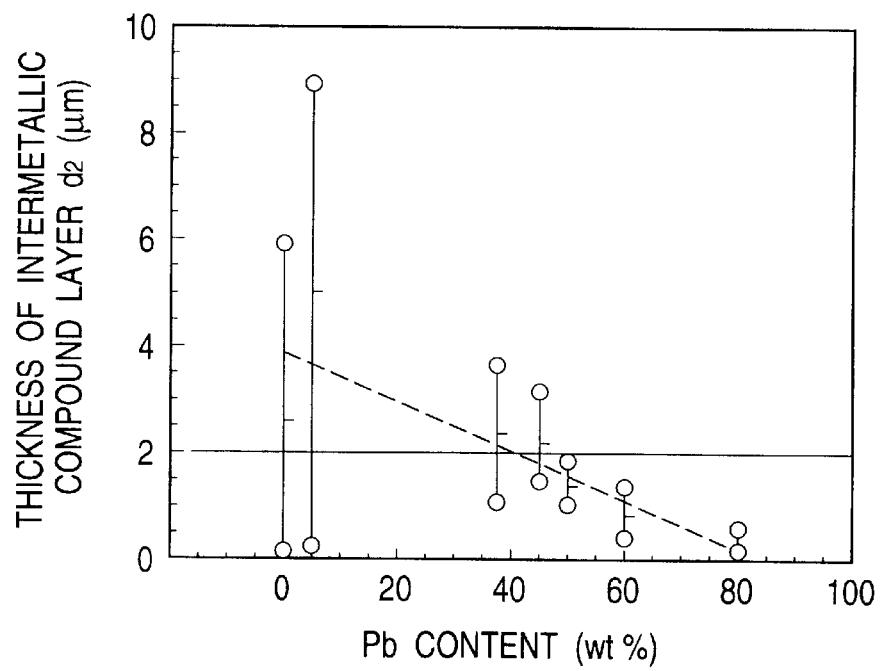
FIG. 7 is a graph showing the result of experiments to measure the corresponding relationship between the Pb content in a solder precoat film and the thickness of an intermetallic compound layer.
Figure 8:
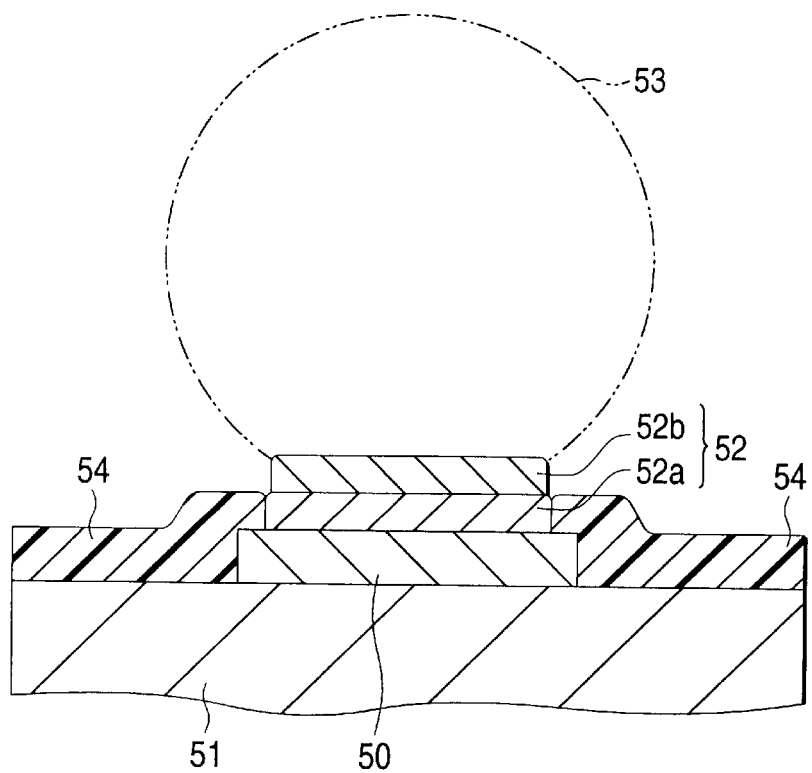
FIG. 8 is a sectional view illustrating a conventional electrode structure.
Figure 9:
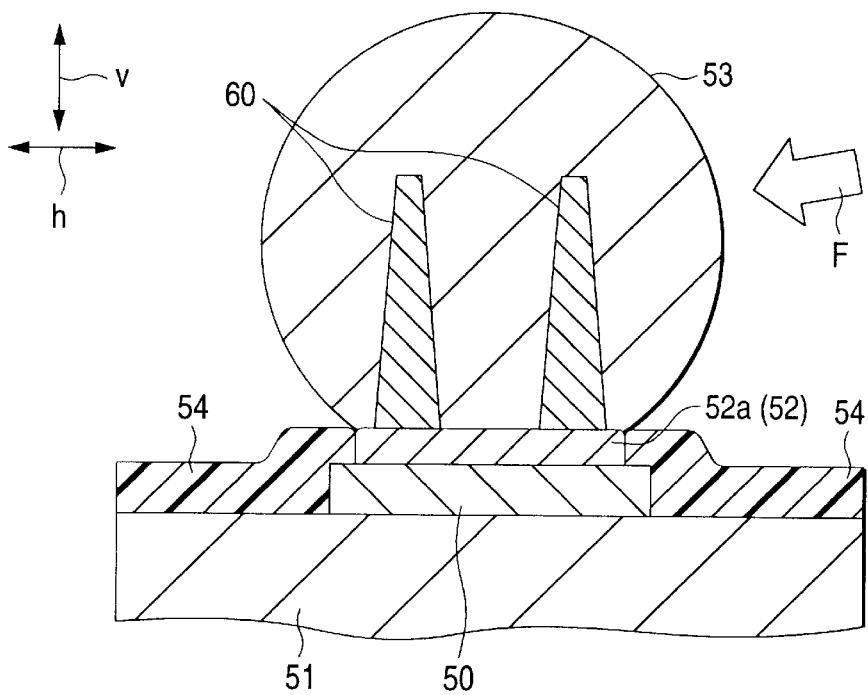
FIGS. 9($a$)–9($b$) illustrate breaking in the conventional electrode.
Figure 9:
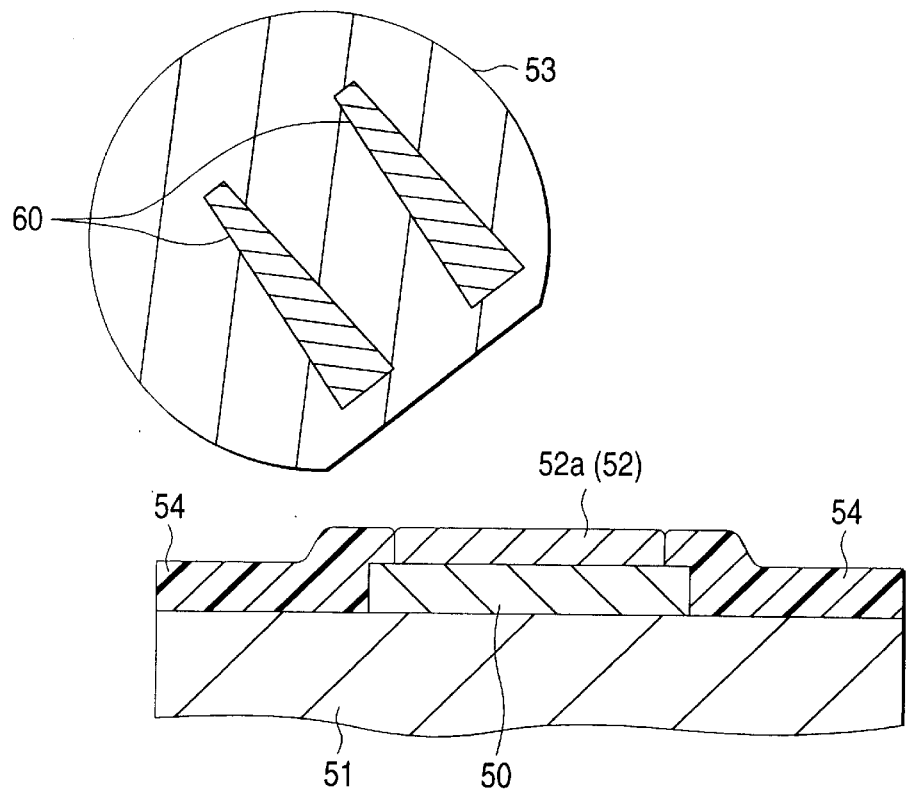

That is, the present inventors measured the thickness d2 of various intermetallic compound layers 24 having different Pb contents. As a result, they confirmed that the higher the Pb content became, the thinner the thickness d2 of the intermetallic compound layer 24 became, as shown by the dotted line (expressing the average value) in FIG. 7.

Particularly, when the Pb content was less than 50 wt %, there was scattering in thickness among the produced intermetallic compound layers 24 such that it was sometimes larger than 2 ($\mu$m) while it was sometimes smaller than 2 ($\mu$m). On the contrary, when the Pb content was selected to be 50 wt % or more, the thickness d2 of the intermetallic compound layers 24 was stabilized to be not less than 2 ($\mu$m). As a result, the intermetallic compound layer 24 was formed in the form of not a column but a layer.

From the above result, it was confirmed that the growth of the intermetallic compound layer 24 in the height-wise direction v was more blocked as the Pb content was higher so that a thin intermetallic compound layer 24 for obtaining a large bonding force could be formed, and when the Pb content was not less than 50 wt %, it was possible to surely obtain a thin intermetallic compound layer 24 to obtain a large bonding force.

Further, although the solder precoat layer 23 is formed of eutectic, by way of example, in the above respective embodiments, the growth of the intermetallic compound layer 24 can be blocked in the height-wise direction v within an acceptable range even in the case where the intermetallic compound layer 24 is not formed of eutectic. Therefore, the solder precoat film 23 may be formed of solder material other than eutectic.

Furthermore, in the above embodiments, description was made upon the case where this invention is applied to a BGA-type semiconductor device having a spherical ball type of bump, by way of example. But, this invention is applicable broadly to semiconductor devices such as CSP-type semiconductor devices and so on, in which a solder bump structure produced by electroless film formation such as electroless plating is provided as an electrode structure.

In addition, various modifications of design can be made within the technical scope of the accompanying claims.

As described above, according to the present invention, a thin solder precoat film is formed on the surface of an electroless barrier metal film. Accordingly, the growth of an intermetallic compound layer is blocked in the height-wise direction. As a result, a thin intermetallic compound layer having a bonded surface bonded to the whole of the surface of the electroless barrier metal film is formed in the solder precoat film in the vicinity of the boundary surface between the solder precoat film and the electroless barrier metal film. This intermetallic compound layer has a strong bonding force.

It is therefore possible to manufacture an electrode having a strong bonding force. Accordingly, when a solder bump is formed on the surface of this solder precoat film, it is possible to prevent the solder bump from defective breaking. It is therefore possible to provide a high-reliability semiconductor device.

In addition, according to the present invention, a thin solder precoat film is formed on the surface of an electroless diffusion prevention film. Generally, an electroless oxidation prevention film is formed on the surface of an electroless diffusion prevention film. However, in this invention, the solder precoat film has a function as such an oxidation prevention film. It is therefore possible to make the process simple in comparison with the case where, for example, a film exclusive-use for preventing oxidation is formed. In addition, it is possible to reduce the cost on a large scale in comparison with the case where expensive material such as an Au film is used as the oxidation prevention film.

Further, when the solder precoat film is made from an alloy having a comparatively high content of lead, it is possible to block the growth of the intermetallic compound layer in the direction along its surface more suitably. It is therefore possible to manufacture an electrode having a larger bonding force. Accordingly, it is possible to prevent the solder bump from defective breaking more effectively, and it is possible to provide a semiconductor device further improved in its reliability.

Furthermore, when the solder precoat film is formed by printing, it is possible to manufacture an electrode through a comparative simple manufacturing process and at a low price.

Further, when the solder precoat film is formed by electroless plating, it is possible to form the film by chemical reaction. Accordingly, it is possible to mount semiconductor devices at high density, increase the number of the pins, make the pad aperture size fine, and so on, easily.

What is claimed is:

1. A method of manufacturing an electrode of a semiconductor device comprising the steps of:
   forming a pad on a substrate surface;
   forming an electroless barrier metal film, as a pad protection film, on said pad; and
   forming a solder precoat layer on a surface of said electroless barrier metal film, having a thickness so that an intermetallic compound layer having a bonded surface bonded substantially to the whole of the surface of said electroless barrier metal film is formed in said solder precoat layer in the vicinity of a boundary surface between said solder precoat film and said electroless barrier metal film.

2. The method of manufacturing an electrode of a semiconductor device as claimed in claim 1, further comprising the step of:
   forming a solder bump on the solder precoat layer.

3. The method of manufacturing an electrode of a semiconductor device according to claim 2, wherein said step of forming a solder precoat layer is a step of forming a Pb—Sn alloy containing lead not less than 37 wt %.

4. The method of manufacturing an electrode of a semiconductor device according to claim 2, wherein said step of forming a solder precoat layer is a step of forming a Pb—Sn alloy containing lead not less than 50 wt %.

5. The method of manufacturing an electrode of a semiconductor device according to claim 2, wherein said solder bump is a spherical solder ball.

6. The method according to claim 2, wherein the intermetallic compound layer is formed in the solder bump.

7. The method of manufacturing an electrode of a semiconductor device according to claim 1, wherein said thickness is not larger than 15 μm.

8. The method of manufacturing an electrode of a semiconductor device according to claim 1, wherein said electroless barrier metal film is formed as a pad material diffusion prevention film.

9. The method of manufacturing an electrode of a semiconductor device according to claim 1, wherein said step of forming a solder precoat layer is a step of coating by a printing method.

10. The method of manufacturing an electrode of a semiconductor device according to claim 1, wherein said step of forming a solder precoat layer is a step of plating by electroless plating method.

11. The method according to claim 1, wherein the pad comprises copper.

12. A method of manufacturing an electrode of a semiconductor device comprising the steps of:
    forming a pad having an upper surface and side surfaces on a substrate surface;
    forming a passivation film on the substrate and on the side surfaces and portions of the upper surface of the pad, leaving an exposed portion of the upper surface of the pad;
    forming an electroless barrier metal film, as a pad protection film, on said exposed upper surface of the pad, the barrier metal film having side surfaces abutting the passivation film on the upper surface of the pad; and
    forming a solder precoat layer on a surface of said electroless barrier metal film, having a thickness so that an intermetallic compound layer having a bonded surface bonded substantially to the whole of the surface of said electroless barrier metal film is formed in said solder precoat layer in the vicinity of a boundary surface between said solder precoat film and said electroless barrier metal film.

13. The method according to claim 12, comprising forming the electroless barrier metal film directly on the exposed upper surface of the pad.

14. The method according to claim 12, wherein the pad comprises copper.

15. The method according to claim 12, comprising forming a solder bump on the solder precoat layer, wherein the intermetallic compound layer is formed within the solder bump.

* * * * *